(12) United States Patent
Chen et al.

(10) Patent No.: US 10,100,428 B2
(45) Date of Patent: *Oct. 16, 2018

(54) METHODS FOR REDUCING THE EROSION RATE OF A CRUCIBLE DURING CRYSTAL PULLING

(71) Applicant: SunEdison, Inc., Maryland Heights, MO (US)

(72) Inventors: Jihong Chen, Cincinnati, OH (US); Tirumani N. Swaminathan, Creve Coeur, MO (US)

(73) Assignee: Corner Star Limited, Hong Kong (HK)

( * ) Notice: Subject to any disclaimer, the term of this patent is extended or adjusted under 35 U.S.C. 154(b) by 46 days.

This patent is subject to a terminal disclaimer.

(21) Appl. No.: 14/802,729

(22) Filed: Jul. 17, 2015

(65) Prior Publication Data

US 2017/0016142 A1 Jan. 19, 2017

(51) Int. Cl.
| | | |
|---|---|---|
| *C30B 15/04* | (2006.01) | |
| *C30B 15/00* | (2006.01) | |
| *C30B 15/10* | (2006.01) | |
| *C30B 29/06* | (2006.01) | |
| *C30B 15/02* | (2006.01) | |

(52) U.S. Cl.
CPC .............. *C30B 15/04* (2013.01); *C30B 15/00* (2013.01); *C30B 15/002* (2013.01); *C30B 15/02* (2013.01); *C30B 15/10* (2013.01); *C30B 29/06* (2013.01)

(58) Field of Classification Search
CPC combination set(s) only.
See application file for complete search history.

(56) References Cited

U.S. PATENT DOCUMENTS

| | | | |
|---|---|---|---|
| 5,676,751 A | 10/1997 | Banan et al. | |
| 5,904,768 A | 5/1999 | Holder | |
| 6,004,393 A * | 12/1999 | Maeda | C30B 15/20 117/200 |
| 8,317,919 B2 | 11/2012 | Bender | |
| 2002/0174828 A1* | 11/2002 | Vasat | C30B 29/06 117/90 |
| 2004/0112274 A1* | 6/2004 | Tsujimoto | C03C 17/004 117/2 |
| 2012/0056135 A1 | 3/2012 | DeLuca et al. | |
| 2015/0233014 A1* | 8/2015 | Luter | C30B 15/12 117/31 |

FOREIGN PATENT DOCUMENTS

| | | | |
|---|---|---|---|
| DE | 2939460 A1 | 10/1981 | |
| JP | 2011184213 A | 9/2011 | |
| JP | 2011184227 A | 9/2011 | |
| WO | WO-2014039976 A1 * | 3/2014 | ............. C30B 15/02 |
| WO | 2014197672 A1 | 12/2014 | |

OTHER PUBLICATIONS

International Search Report and Written Opinion, International Patent Application No. PCT/US2016/042442, dated Nov. 18, 2016, 11 pages.

* cited by examiner

*Primary Examiner* — Erin F Bergner
(74) *Attorney, Agent, or Firm* — Armstrong Teasdale LLP

(57) ABSTRACT

Production of silicon ingots in a crystal puller that involve reduction of the erosion rate at the crucible contact point are disclosed.

22 Claims, 7 Drawing Sheets

METHODS FOR REDUCING THE EROSION RATE OF A CRUCIBLE DURING CRYSTAL PULLING

FIELD OF THE DISCLOSURE

The field of the disclosure relates to production of silicon ingots in a crystal puller and, in particular, methods that reduce the crucible erosion rate at the interface between the crucible, the melt and the atmosphere.

BACKGROUND

Silicon ingots may be grown by the so-called Czochralski process in which a silicon ingot is pulled upward from a melt of silicon in a crystal puller apparatus. The process may be a continuous process in which silicon is intermittently or continuously added to the crucible as polycrystalline chunks or as pre-melted silicon or may be a batch process in which the ingot is withdrawn until silicon within the crucible is consumed.

Crystal pulling may be performed in the presence of an atmosphere within a housing of the puller, the atmosphere forming an interface with the melt. During continuous crystal pulling operations, the crucible erodes especially at the interface formed between the melt, the atmosphere and the crucible (i.e., the contact point). Erosion may degrade the crucible at the contact point to such an extent that the crucible becomes porous and solid particles may reach the growth zone from which the ingot is pulled. These solids degrade the lattice structure of the growing crystal and the growing process must be stopped due to degrading crystal yield.

A need exists for methods that involve reduction in the erosion rate at the crucible at the interface between the melt, the atmosphere and the crucible.

This section is intended to introduce the reader to various aspects of art that may be related to various aspects of the disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

One aspect of the present disclosure is directed to a method for reducing the erosion rate of a crucible during preparation of a silicon ingot. The ingot is formed by pulling the silicon ingot from a melt of silicon within the crucible. The crucible is positioned within a housing having an atmosphere therein with the melt and atmosphere forming a melt-gas interface. A dopant selected from the group consisting of indium, gallium, thallium, arsenic, antimony and combinations thereof is introduced into the silicon melt to alter the oxygen evaporation profile of the melt. A silicon ingot is withdrawn from the doped melt. The atmosphere is at a pressure of at least about 5 kPa while withdrawing the silicon ingot.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

Corresponding reference characters indicate corresponding parts throughout the drawings.

DETAILED DESCRIPTION

Generally, the processes of the present disclosure involve continuous Czochralski growing methods in which silicon is replenished continuously or intermittently to a crucible while the ingot is being pulled from the melt. An exemplary continuous crystal puller is described and shown in U.S. Pat. No. 8,317,919, which is incorporated herein by reference for all relevant and consistent purposes. Continuous pullers generally operate similarly to the batch puller shown in FIG. 1 but include a crucible feed zone in which silicon is replenished in the crucible and include a crucible grow zone from which the ingot is pulled. In this regard, the ingot puller 23 of FIG. 1 is shown to illustrate Czochralski growth processes generally and the present disclosure should not be limited to a batch Czochralski method.

Figure 1:
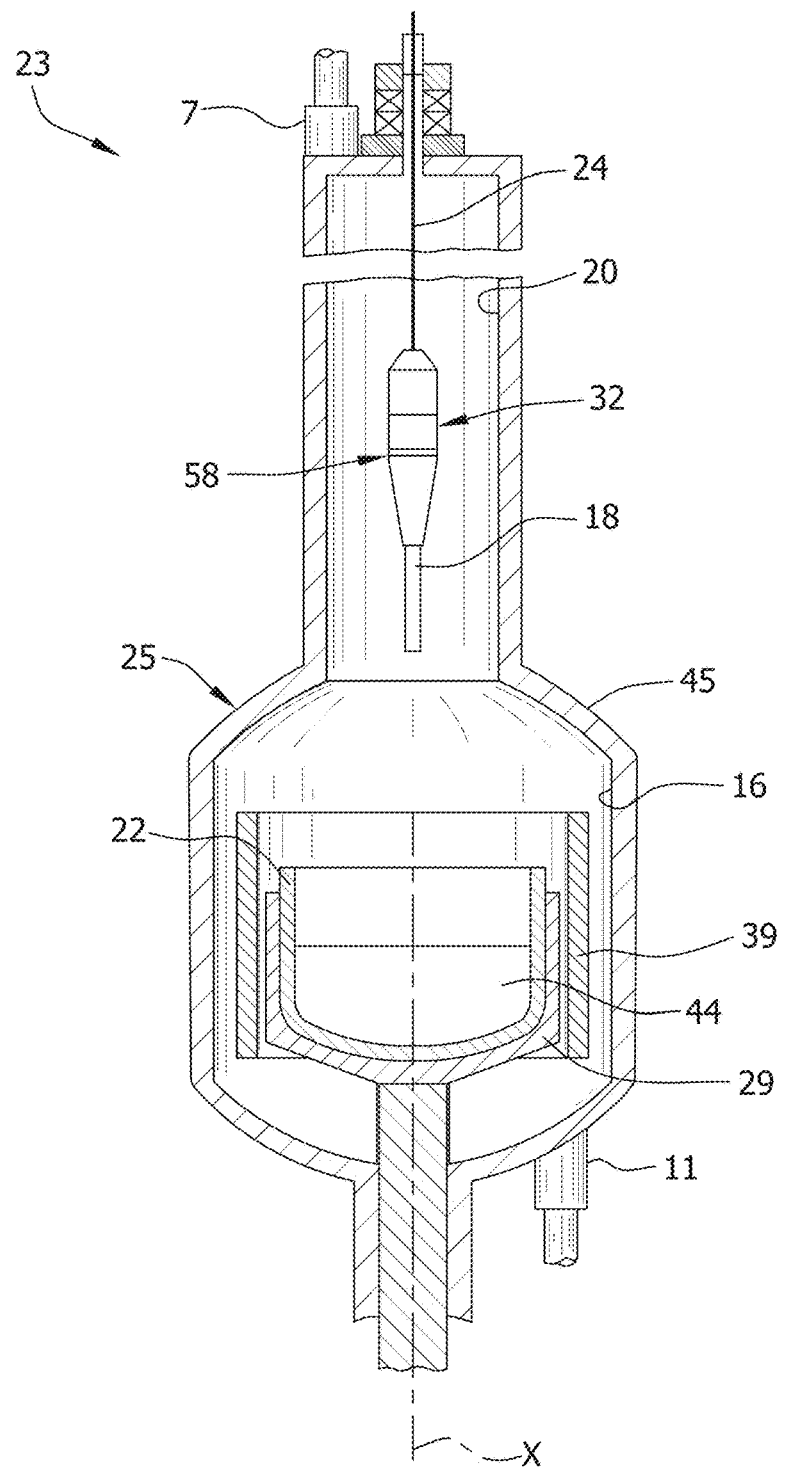
FIG. 1 is a schematic of a silicon ingot pulling apparatus.

Referring now to FIG. 1, the ingot puller 23 includes a housing 25 that defines a crystal growth chamber 16 and a pull chamber 20 having a smaller transverse dimension than the growth chamber. The growth chamber 16 has a generally dome shaped upper wall 45 transitioning from the growth chamber 16 to the narrowed pull chamber 20. The ingot puller 23 includes an inlet port 7 and an outlet port 11 which may be used to introduce and remove a process gas to and from the housing 25 during crystal growth.

A crucible 22 within the ingot puller 23 contains a silicon melt 44 from which a silicon ingot is drawn. The silicon melt 44 is obtained by melting polycrystalline silicon charged to the crucible 22. The crucible 22 is mounted on a turntable 29 for rotation of the crucible about a central longitudinal axis X of the ingot puller 23. In this regard, it should be understood that, in certain embodiments, the crucible is not rotated. In continuous Czochralski processes, the crucible 22 may include a weir or other divider to separate the melt zone from the growth zone. Such continuous systems include components for replenishing silicon into the melt zone.

An electrical resistance heater 39 surrounds the crucible 22 for melting the silicon charge to produce the melt 44. The heater 39 may also extend below the crucible as shown in U.S. Pat. No. 8,317,919. The heater 39 is controlled by a control system (not shown) so that the temperature of the melt 44 is precisely controlled throughout the pulling process. Insulation (not shown) surrounding the heater 39 may reduce the amount of heat lost through the housing 25. The ingot puller 23 may also include a heat shield assembly (not shown) above the melt surface for shielding the ingot from the heat of the crucible 22 to increase the axial temperature gradient at the solid-melt interface.

A pulling mechanism (not shown) is attached to a pull wire 24 that extends down from the mechanism. The mechanism is capable of raising and lowering the pull wire 24. The ingot puller 23 may have a pull shaft rather than a wire, depending upon the type of puller. The pull wire 24 terminates in a pulling assembly 58 that includes a seed crystal chuck 32 which holds a seed crystal 18 used to grow the silicon ingot. In growing the ingot, the pulling mechanism lowers the seed crystal 18 until it contacts the surface of the silicon melt 44. Once the seed crystal 18 begins to melt, the pulling mechanism slowly raises the seed crystal up through the growth chamber 16 and pull chamber 20 to grow the monocrystalline or multicrystalline ingot. The speed at which the pulling mechanism rotates the seed crystal 18 and the speed at which the pulling mechanism raises the seed crystal (i.e., the pull rate v) are controlled by the control system. The general construction and operation of the ingot puller 23 is conventional and known by those of ordinary skill in the art.

Figure 2:
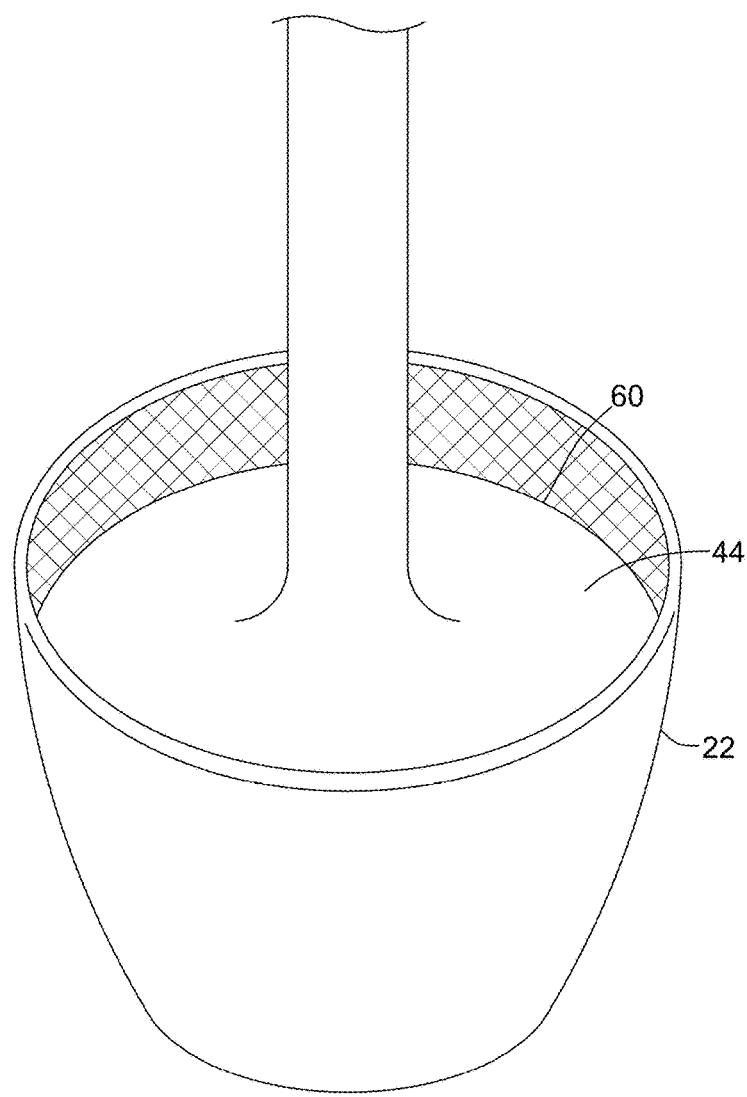
FIG. 2 is a perspective view of a crucible for holding a silicon melt.

In continuous Czochralski ingot pulling methods, silicon may be added in its solid state (e.g., silicon granules) in which case the silicon is melted in the crucible or silicon may be pre-melted and added to the crucible in its liquid form. As opposed to embodiments in which a discrete ingot is pulled by drawing down the level of the melt until the entire melt is consumed, in embodiments in which silicon is added to the melt to replenish the melt, the level of melt in the ingot remains largely uniform. This creates a melt-gas-crucible contact point (or simply "contact point") 60 (FIG. 2) at the interface between the melt 44, the atmosphere and the crucible 22.

A process gas is introduced through the inlet port 7 into the housing 25 and is withdrawn from the outlet port 11. The process gas creates an atmosphere within the housing and the melt and atmosphere form a melt-gas interface. The outlet port 11 is in fluid communication with an exhaust system (not shown) of the ingot puller.

The silicon ingot that forms in the crystal puller may be a single crystal silicon ingot. Alternatively, the ingot may have a multicrystalline structure (e.g., an average nominal crystal size of at least about 1 mm). The average nominal crystal grain size may be evaluated by observing the light reflectance in a wafer sliced from the silicon ingot. The crystal grains reflect the light in different directions due to the difference in crystal orientation between grains. The nominal distance between grain boundaries may be evaluated across the wafer and averaged.

The crucible 22 may be composed of quartz. It should be noted that the terms "quartz" and "silica" as used herein are synonymous and refer to material composed of silica, i.e., $SiO_2$, and the term "quartz" should not be limited to quartz mineral. The crucible may contain at least about 10 wt % silica and, in other embodiments, contains at least about 25 wt %, at least about 50 wt %, at least about 75 wt %, at least about 85 wt %, at least about 95 wt %, at least about 99 wt %, from about 10 wt % to about 100 wt %, from about 50 wt % to about 100 wt %, from about 85 wt % to about 100 wt % or from about 95 wt % to about 100 wt % silica. In some embodiments, the crucible consists essentially of silica (i.e., the source contains only silica and minor amounts of impurities).

The crucible 22 may be a clear-wall crucible or may be an opaque crucible containing bubbles. The particular dimensions of the crucible may be chosen by those of skill in the art based on the particular use of the crucible (e.g., ingot diameter, crystal puller dimensions, continuous or batch processing and the like). Generally most crucibles are cylindrical and have a base (which may be flat or curved) and a sidewall. Other arrangements may be used such as square or rectangular crucibles which have more than one sidewall without limitation. In embodiments wherein the crucible is used to hold molten silicon for growth of single crystal silicon ingots, the thickness of the crucible base and sidewalls may be at least about 6 mm or, as in other embodiments, at least about 8 mm, at least about 10 mm or even at least about 14 mm (e.g., from about 6 mm to about 40 mm, from about 6 mm to about 30 mm, from about 6 mm to about 20 mm or from about 10 mm to about 40 mm).

In some embodiments, the crucible 22 includes a silica surface disposed on a substrate. The surface layer of silica may have a thickness of at least about 1 mm or, as in other embodiments, at least about 2 mm, at least about 4 mm, from about 1 mm to about 7 mm, from about 1 mm to about 4 mm or from about 2 mm to about 5 mm. In this regard, silica may be formed on only a portion of the crucible (i.e., on the inner surface of the crucible that contacts the molten material during use) and the other portions of the crucible can be masked or otherwise made from contacting the gas stream. The silica surface layer may include at least about 95 wt % silica, at least about 99 wt % silica or even consists essentially of silica.

The substrate upon which the layer of silica is deposited may be made of any suitable material for high temperature operations such as, for example, graphite or graphite coated with SiC or fused vitreous silica. In some embodiments, the substrate comprises at least about 10 wt % silica or at least about 25 wt %, at least about 50 wt %, at least about 75 wt %, at least about 85 wt %, at least about 95 wt %, at least about 99 wt % silica, from about 10 wt % to about 100 wt %, from about 50 wt % to about 100 wt %, from about 85 wt % to about 100 wt % or from about 95 wt % to about 100 wt % silica.

In accordance with embodiments of the present disclosure, a dopant selected from the group consisting of indium, gallium, thallium, arsenic, antimony and combinations thereof is introduced into the silicon melt to reduce the erosion rate of the crucible at the contact point. The dopant alters the oxygen evaporation profile of the melt. The dopant may cause oxygen to be more readily evaporated from the melt surface which allows more oxygen to be evaporated from the bulk of the melt and less from the crucible interface (i.e., shift evaporation toward the region of the melt that is closer to the ingot and from the region of the melt that is farther away). By shifting melt oxygen evaporation from the melt-crucible-atmosphere interface to the silicon bulk, oxygen more evenly dissolves from all faces of the crucible and less from the contact point 60. The increased evaporation rate may also allow the concentration of oxygen to be reduced in the melt which can improve the quality of the ingot.

Generally, dopant is added to reduce the crucible erosion rate during continuous Czochralski processes (i.e., wherein the melt is replenished by adding silicon to the crucible) as the contact point moves in batch ingot production as the melt level changes during depletion of melt in such batch processes. In continuous processes, dopant may be added to the melt separately from addition of silicon into the crucible or may be added with silicon into the crucible. Indium, gallium or thallium may be used for P-type silicon growth and arsenic or antimony may be used for N-type silicon growth.

When P-type growth is desired, boron or aluminum may be used in addition to the indium, gallium or thallium dopant to achieve the desired resistivity. When N-type growth is desired, phosphorus may be used in addition to arsenic or antimony.

Generally, addition of any amount of indium, gallium, thallium, arsenic or antimony results in a reduction in erosion at the contact point. In some embodiments, dopant is added at a rate at which the melt has a concentration of from about $1 \times 10^{15}$ atoms per $cm^3$ to about $1 \times 10^{20}$ atoms/$cm^3$. Alternatively or in addition, dopant is added at a rate such that the silicon melt has a resistivity (p-type or n-type) of about 0.01 ohm-cm to about 6 ohm-cm or from about 0.5 ohm-cm to about 6 ohm-cm. Combinations of dopants may be added in which case the total amount of dopant is added in an amount to achieve the various concentrations and/or resistivities recited above. The dopant may be relatively pure and, as in some embodiments, has a purity of at least about 99.999 wt % or at least about 99.9999 wt % or even more.

During ingot growth, the atmosphere in the ingot puller housing may be at an increased pressure relative to conventional methods in which dopant is not used. This increase in pressure may suppress the rate of oxygen evaporation from the melt which reduces the total erosion rate of the crucible. The increase in pressure (which decreases evaporation) counterbalances the increased evaporation caused by the use of dopant which allows an ingot with substantially similar crystal quality to be produced relative to methods that do not involve use of dopant. In this regard, the methods of the present disclosure should not be limited to a particular mode of operation or effect.

In some embodiments, the atmosphere in the ingot puller housing is at least about 5 kPa while withdrawing the silicon ingot. In other embodiments the atmosphere is at a pressure of at least about 7 kPa while withdrawing the silicon ingot or at least about 9 kPa, at least about 11 kPa, at least about 13 kPa, from about 5 kPa to about 15 kPa, from about 5 kPa to about 13 kPa, from about 7 kPa to about 15 kPa or from about 9 kPa to about 15 kPa while withdrawing the silicon ingot.

Generally, the pressure is maintained at the ranges stated above for the majority of the crystal growth process (e.g., at least about 80% of the crystal growth process or at least about 90%, at least about 95%, at least about 99% or even the entire crystal growth process). As used herein, the "crystal growth process" refers to growth of the body of the ingot, i.e., after neck growth and until later termination of growth and shut down of the puller. In some embodiments, the pressure is ramped up to the stated range during neck growth and throughout growth of the body of the ingot.

In some embodiments, the pressure in the housing is adjusted to offset the increased oxygen evaporation caused by dopant addition. This allows the overall rate of oxygen evaporation and overall oxygen dissolution from the crucible to remain generally unchanged. In some embodiments, a baseline pressure for withdrawing the silicon ingot from the melt without dopant being introduced into the melt is established. Addition of dopant (or an increase in dopant addition) is commenced to alter the oxygen evaporation profile of the melt. The pressure of the atmosphere is increased to offset an increase in oxygen evaporation from the melt caused by addition of dopant into the melt.

EXAMPLES

The processes of the present disclosure are further illustrated by the following Examples. These Examples should not be viewed in a limiting sense.

Example 1: Reduction of Crucible Erosion Rate

Indium dopant was added during silicon ingot growth in a continuous Czochralski process to achieve a resistivity from 0.5 ohm-cm to 6 ohm-cm. Dopant was added in three runs—one with a 51 cm (20 inch) diameter crucible, one with a 61 cm (24 inch) diameter and one with an 81 cm (32 inch) diameter crucible. The system pressure was about 8 kPa for each run compared to a 3 kPa conventional system pressure. Each run was 247 hours in length.

Figure 3:
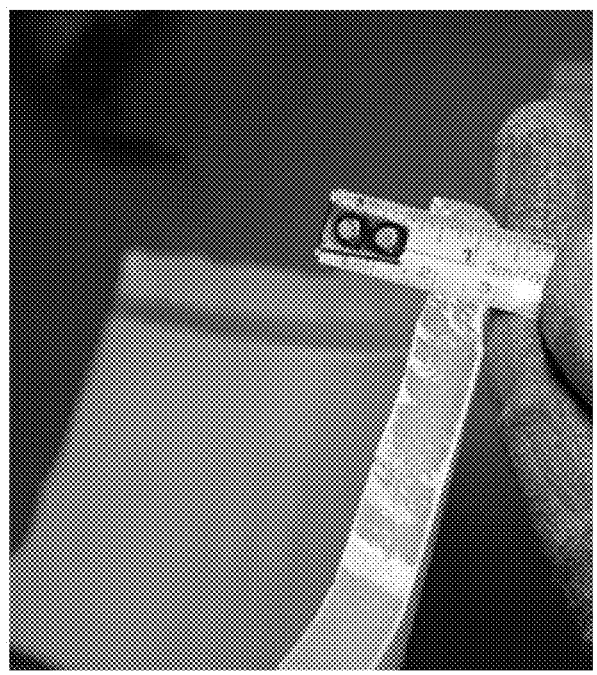
FIG. 3 is a photograph of the erosion of a 51 cm (20 inch) crucible at the contact point using indium dopant in the melt.
Figure 4:
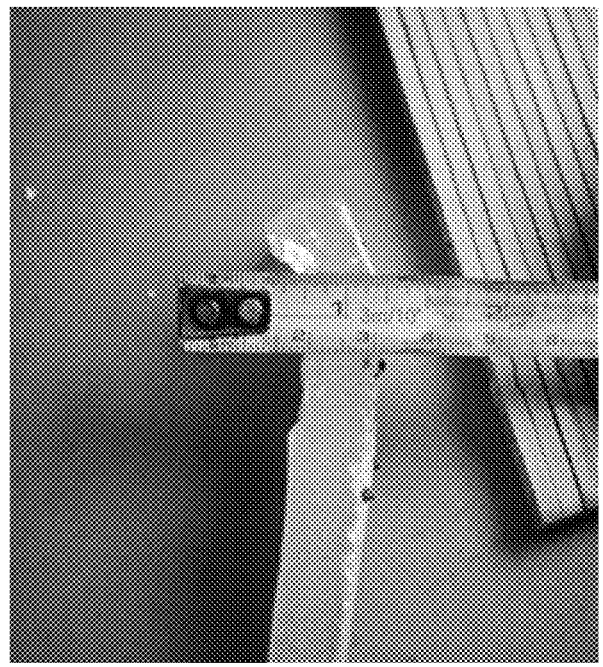
FIG. 4 is a photograph of the erosion of a 61 cm (24 inch) crucible at the contact point using indium dopant in the melt.
Figure 5:
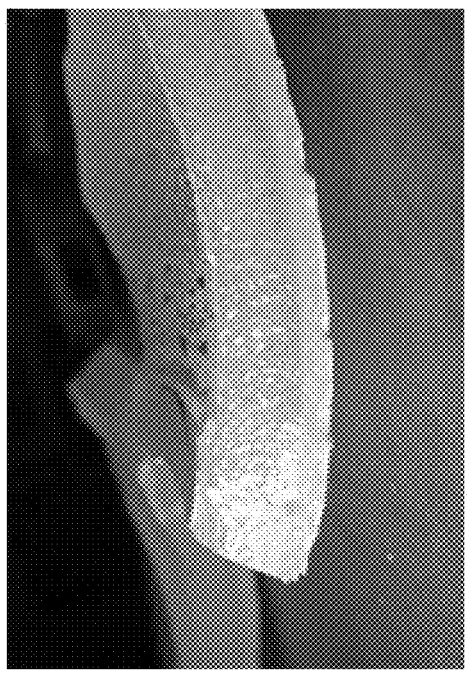
FIG. 5 is a photograph of the erosion of a 81 cm (32 inch) diameter crucible at the contact point using indium dopant in the melt.

The crucible erosion at the contact point line for the 51 cm (20 inch) diameter crucible is shown in FIG. 3, for the 61 cm (24 inch) diameter crucible in FIG. 4 and for the 81 cm (32 inch) diameter crucible in FIG. 5. The rate of erosion for the 51 cm (20 inch) diameter crucible was about 6.6 µm/hour and the erosion for the 61 cm (24 inch) diameter crucible and 81 cm (32 inch) diameter crucible was too small for measurement. The erosion rate for the crucibles was less than 50% of the erosion rate during typical boron-doped runs.

Example 2: Effect of Indium on Melt Oxygen Concentration

Figure 6:
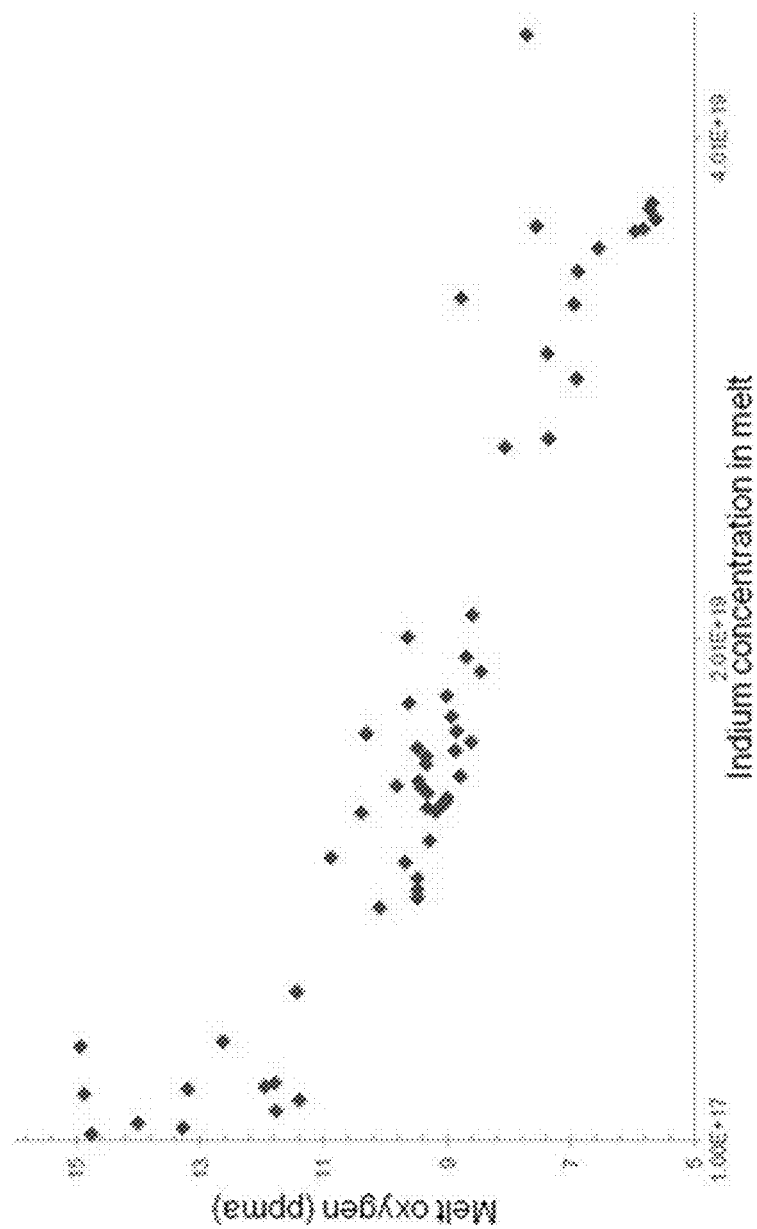
FIG. 6 is a graph showing the oxygen concentration in the melt at different indium concentrations.
Figure 7:
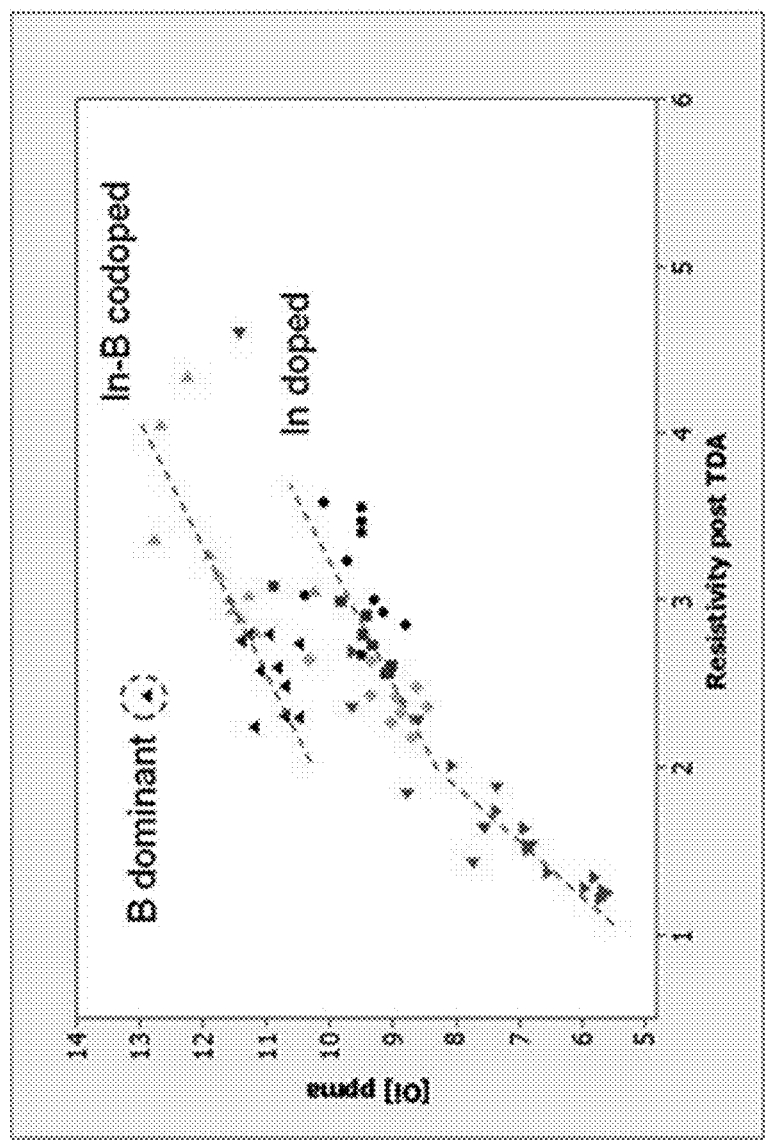
FIG. 7 is a graph showing the oxygen concentration in the melt at different resistivites with indium doping.

The oxygen concentration of the melt was measured over several runs with different indium concentrations in the melt (FIG. 6). As can be seen from FIG. 6, as the indium concentration in the melt increases, the oxygen concentration decreases. This decrease in oxygen concentration may be off-set by increasing the ingot puller atmosphere pressure as described above. FIG. 7 shows the oxygen correlation with resistivity after thermal donor annihilation (TDA) with resistivity increasing with increasing indium concentration.

As used herein, the terms "about," "substantially," "essentially" and "approximately" when used in conjunction with ranges of dimensions, concentrations, temperatures or other physical or chemical properties or characteristics is meant to cover variations that may exist in the upper and/or lower limits of the ranges of the properties or characteristics, including, for example, variations resulting from rounding, measurement methodology or other statistical variation.

When introducing elements of the present disclosure or the embodiment(s) thereof, the articles "a", "an", "the" and "said" are intended to mean that there are one or more of the elements. The terms "comprising," "including," "containing" and "having" are intended to be inclusive and mean that there may be additional elements other than the listed elements. The use of terms indicating a particular orientation (e.g., "top", "bottom", "side", etc.) is for convenience of description and does not require any particular orientation of the item described.

As various changes could be made in the above constructions and methods without departing from the scope of the disclosure, it is intended that all matter contained in the above description and shown in the accompanying drawing [s] shall be interpreted as illustrative and not in a limiting sense.

What is claimed is:

1. A method for reducing the erosion rate of a crucible during preparation of a silicon ingot, the ingot being formed by pulling the silicon ingot from a melt of silicon within the crucible, the crucible being positioned within a housing having an atmosphere therein, the melt and atmosphere forming a melt-gas interface, the method comprising:

introducing a first dopant into the silicon melt to achieve a desired silicon ingot resistivity, the first dopant being selected from the group consisting of boron and phosphorous;

introducing a second dopant selected from the group consisting of indium, gallium, thallium, arsenic, antimony and combinations thereof into the silicon melt to alter the oxygen evaporation profile of the melt, the second dopant being different from the first dopant; and withdrawing a silicon ingot from the doped melt within the crucible, the melt, crucible and atmosphere forming an interface at which the crucible is eroded, the atmosphere being at a pressure of at least about 5 kPa while withdrawing the silicon ingot, the crucible being made of quartz with quartz contacting the silicon melt, the second dopant reducing erosion at the interface between the melt, crucible and atmosphere.

2. The method as set forth in claim 1 comprising replenishing the silicon melt by adding silicon to the crucible.

3. The method as set forth in claim 2 wherein the second dopant is added intermittently or continuously to the melt to replenish the second dopant in the melt.

4. The method as set forth in claim 1 wherein the atmosphere is at a pressure of at least about 7 kPa while withdrawing the silicon ingot.

5. The method as set forth in claim 1 further comprising:

establishing a baseline pressure for withdrawing the silicon ingot from the melt without second dopant being introduced into the melt;

commencing addition of second dopant into the melt to alter the oxygen evaporation profile of the melt; and increasing the pressure of the atmosphere above the baseline pressure to offset an increase in oxygen evaporation from the melt caused by addition of second dopant into the melt.

6. The method as set forth in claim 5 wherein increasing the pressure of the atmosphere above the baseline pressure reduces the rate of erosion at an interface between the crucible, the melt and the atmosphere.

7. The method as set forth in claim 1 wherein second dopant is added to the melt separately from the addition of silicon.

8. The method as set forth in claim 1 wherein second dopant is added with silicon.

9. The method as set forth in claim 1 wherein the second dopant is added at a rate to achieve a concentration of $1 \times 10^{15}$ atoms per $cm^3$ to about $1 \times 10^{20}$ atoms/$cm^3$ in the melt.

10. The method as set forth in claim 1 wherein the first and/or second dopant is added at a rate to produce a silicon ingot with a resistivity of about 0.01 ohm-cm to about 6 ohm-cm.

11. The method as set forth in claim 1 wherein the atmosphere is at the recited pressure during at least about 80% of the crystal growth process.

12. The method as set forth in claim 1 wherein the atmosphere is at a pressure of at least about 13 kPa while withdrawing the silicon ingot.

13. The method as set forth in claim 1 wherein the first and/or second dopant is added at a rate to produce a silicon ingot with a resistivity of about 0.5 ohm-cm to about 6 ohm-cm.

14. The method as set forth in claim 1 wherein the quartz crucible contains at least about 90 wt % silica.

15. The method as set forth in claim 1 wherein the quartz crucible contains at least about 99 wt % silica.

16. The method as set forth in claim 1 wherein the atmosphere is at the recited pressure during at least about 95% of the crystal growth process.

17. The method as set forth in claim 1 wherein the atmosphere is at the recited pressure during the entire crystal growth process.

18. The method as set forth in claim 1 wherein the first dopant is boron to achieve P-type growth.

19. The method as set forth in claim 18 wherein the second dopant is selected from the group consisting of indium, gallium and thallium.

20. The method as set forth in claim 1 wherein the first dopant is phosphorous to achieve N-type growth.

21. The method as set forth in claim 20 wherein the second dopant is selected from arsenic and antimony.

22. The method as set forth in claim 1 wherein the atmosphere is controlled to be the same pressure while withdrawing the silicon ingot.

* * * * *